(12) United States Patent
Chung et al.

(10) Patent No.: US 9,825,052 B2
(45) Date of Patent: Nov. 21, 2017

(54) MEMORY DEVICE AND METHOD OF FORMING THE SAME

(71) Applicant: MACRONIX International Co., Ltd., Hsinchu (TW)

(72) Inventors: Yao-An Chung, Hsinchu (TW); Shih-Ping Hong, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 14/795,689

(22) Filed: Jul. 9, 2015

(65) Prior Publication Data
US 2017/0011995 A1    Jan. 12, 2017

(51) Int. Cl.
| H01L 21/336 | (2006.01) |
| H01L 27/11582 | (2017.01) |
| H01L 27/11565 | (2017.01) |
| H01L 27/11578 | (2017.01) |

(52) U.S. Cl.
CPC .. *H01L 27/11582* (2013.01); *H01L 27/11565* (2013.01); *H01L 27/11578* (2013.01)

(58) Field of Classification Search
CPC ................................................ H01L 27/11578
USPC ........................................................ 438/287
See application file for complete search history.

(56) References Cited

U.S. PATENT DOCUMENTS

| 2010/0276743 | A1* | 11/2010 | Kuniya | H01L 27/115 257/315 |
| 2011/0147824 | A1* | 6/2011 | Son | G11C 16/0483 257/324 |
| 2012/0117316 | A1* | 5/2012 | Park | H01L 27/115 711/103 |
| 2012/0120728 | A1 | 5/2012 | Kim et al. | |
| 2013/0299885 | A1* | 11/2013 | Zhu | H01L 29/66795 257/288 |

FOREIGN PATENT DOCUMENTS

| TW | 200614425 | 5/2006 |
| TW | 201023355 | 6/2010 |
| TW | 201444026 | 11/2014 |

OTHER PUBLICATIONS

"Office Action of Taiwan Counterpart Application", dated Sep. 12, 2016, p. 1-p. 6, in which the listed references were cited.

* cited by examiner

*Primary Examiner* — Hsin-Yi Hsieh
(74) *Attorney, Agent, or Firm* — J.C. Patents

(57) ABSTRACT

Provided is a memory device including a plurality of bit line layers and a plurality of supporting structures. Each bit line layer extends in a plane defined by a first direction and a second direction and has a plurality of bit lines extending along the first direction. Each bit line has a plurality of wide parts and a plurality of narrow parts arranged alternately. The supporting structures are disposed between the wide parts of the corresponding bit lines of adjacent bit line layers. Besides, each narrow part of each bit line substantially has an ellipse-like shape in cross section, and each narrow part has a rounding ratio (RR) of greater than about 30%.

8 Claims, 17 Drawing Sheets

MEMORY DEVICE AND METHOD OF FORMING THE SAME

BACKGROUND OF THE INVENTION

Field of Invention

The present invention relates to a semiconductor device and a method of forming the same, and more particularly to a memory device and a method of forming the same.

Description of Related Art

Advancements in electronic devices lead to the need for greater storage capabilities. In order to satisfy the high storage density requirement, the size of a memory device is gradually decreased and the level of integration is accordingly increased. Therefore, the type of a memory device is developed from a two-dimensional planar gate structure to a three-dimensional vertical gate structure. One of vertical gate structures is a gate-all-around (GAA) structure.

In a three-dimensional device having a GAA structure, a higher local electric field is often observed at the corner of each bit line, and thus, the local charge storage uniformity is affected. Therefore, how to fabricate a three-dimensional memory device with an improved bit line shape has drawn high attention in the industry.

SUMMARY OF THE INVENTION

The present invention is directed to a memory device and a method of forming the same, in which an improved bit line shape is provided, and the local electric field uniformity of a charge storage layer is accordingly enhanced.

The present invention provides a memory device including a plurality of bit line layers and a plurality of supporting structures. Each bit line layer extends in a plane defined by a first direction and a second direction and has a plurality of bit lines extending along the first direction. Each bit line has a plurality of wide parts and a plurality of narrow parts arranged alternately. The supporting structures are disposed between the wide parts of the corresponding bit lines of adjacent bit line layers. Besides, each narrow part of each bit line substantially has an ellipse-like shape, and each narrow part has a rounding ratio (RR) of greater than about 30%, and the rounding ratio is defined by formula (1):

$$RR = \frac{(N-c)}{(N-r)} \times 100\%, \quad (1)$$

$$r = \frac{ab}{\sqrt{a^2\sin^2\theta + b^2\cos^2\theta}}, \quad (2)$$

wherein r is defined by formula (2);

a is a length of a major semi-axis of the ellipse-like shape;

b is a length of a minor semi-axis of the ellipse-like shape;

N is a length of a diagonal line of a rectangular defined by the major semi-axis and the minor semi-axis of the ellipse-like shape;

θ is an included angle between the diagonal line of the rectangle and the major semi-axis of the ellipse-like shape; and c is a distance from a center of the ellipse-like shape, along the diagonal line of the rectangle, to an edge of the ellipse-like shape.

According to an embodiment of the present invention, a material of the bit lines is different from a material of the supporting structures.

According to an embodiment of the present invention, the bit lines include polysilicon, doped polysilicon, monocrystalline silicon or a combination thereof.

According to an embodiment of the present invention, the memory device further includes a charge storage layer and a plurality of conductive layers. The charge storage layer covers surfaces of the bit lines and the supporting structures. Each conductive layer extends in a plane defined by the second direction and a third direction, is disposed between adjacent supporting structures, and surrounds a portion of the charge storage layer on the narrow parts of the corresponding the bit lines, wherein the first direction, the second direction and the third direction are perpendicular to each other.

According to an embodiment of the present invention, the memory device includes a plurality of memory cells, and each narrow part of each bit line, and a portion of the charge storage layer and a portion of the conductive layer which cover the narrow part constitute one memory cell.

According to an embodiment of the present invention, the memory device further includes a plurality of dielectric pillars extending along the third direction, wherein one dielectric pillar is disposed between two adjacent supporting structures.

The present invention is directed to a method of forming a memory device. A stacked layer is provided, wherein the stacked layer includes at least two first conductive layers and at least one supporting material layer, the supporting material layer is disposed between the first conductive layers, the first conductive layers and the supporting material layer have different materials, and the supporting material layer and the first conductive layers all extend in a plane defined by a first direction and a second direction. A plurality of openings is formed in the stacked layer, and the openings penetrate through the stacked layer. An etching process is performed to remove a portion of the supporting material layer from the openings, so as to form a plurality of supporting structures between the first conductive layers. A rounding process is performed to the first conductive layers.

According to an embodiment of the present invention, the etching process includes a dry etching process, a wet etching process or a combination thereof.

According to an embodiment of the present invention, an etching selectivity ratio of the supporting material layer to the first conductive layers is greater than about 5.

According to an embodiment of the present invention, the rounding process includes a manufacturing process consisting of a wet etching process, an oxidation process or a combination thereof.

According to an embodiment of the present invention, the rounding process is performed after the etching process.

According to an embodiment of the present invention, the rounding process includes a wet etching process.

According to an embodiment of the present invention, an etchant of the wet etching process includes an ammonium hydroxide solution, a hydrogen peroxide solution, a diluted hydrofluoric acid solution or a combination thereof.

According to an embodiment of the present invention, the rounding process is performed before the etching process.

According to an embodiment of the present invention, the rounding process includes an oxidation process.

According to an embodiment of the present invention, the oxidation process includes an in-situ steam generation (ISSG), a wet oxidation, a thermal oxidation or a combination thereof.

According to an embodiment of the present invention, the rounding process and the etching process are performed simultaneously.

According to an embodiment of the present invention, the rounding process and the etching process include using a diluted hydrofluoric acid solution.

According to an embodiment of the present invention, after the step of forming the supporting structures, the method further includes the following steps. A charge storage layer is formed on surfaces of the first conductive layers and the supporting structures. A plurality of second conductive layers is formed to fill in a space between the first conductive layers, the supporting structures and the charge storage layer, wherein each second conductive layer extends in a plane defined by the second direction and a third direction, and the first direction, the second direction and the third direction are perpendicular to each other. A plurality of dielectric pillars is formed to extend along the third direction, wherein the dielectric pillars are formed in a manner such that each first conductive layer is divided into a plurality of bit lines extending along the first direction.

According to an embodiment of the present invention, the first conductive layers include polysilicon, doped polysilicon, monocrystalline silicon or a combination thereof.

In view of above, in the present invention, a rounding process is performed to improve the bit line shape and therefore increase the curvature of each bit line. Since the curvature of each bit line is increased, the curvature of the charge storage layer covering the surface of the bit line is accordingly increased. Therefore, when the memory device of the invention is operated, a higher local electric field at the corner of each bit line is avoided, and the local electric field uniformity of the charge storage layer is thereby improved.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
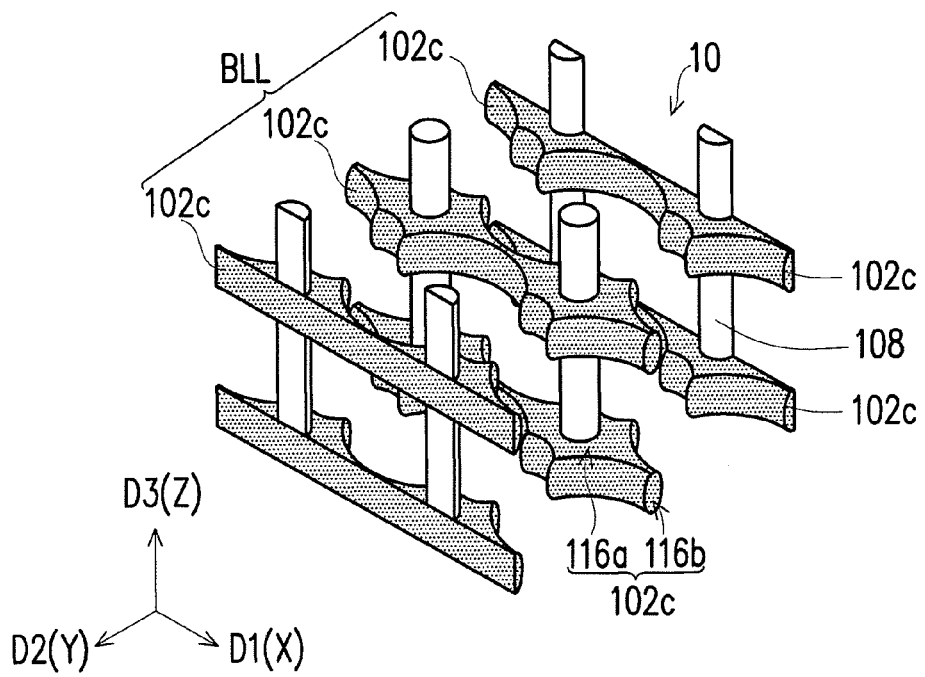
FIG. 1 is a schematic perspective view of a memory device according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Through the description, the term "ellipse" refers to a symmetric shape having two mutually perpendicular axes which intersect at the center thereof due to its symmetry. Similarly, the term "ellipse-like" refers to a shape like an ellipse and having two mutually perpendicular axes which intersect at the center thereof. The ellipse-like shape may not be provided with a smooth periphery or contour and may not be as symmetric as an ellipse due to the process variation and tolerance. However, viewing the shape as the whole, the ellipse-like can be interpreted as an ellipse to some extent.

The larger of these two axes, which corresponds to the largest distance between antipodal points on the ellipse or ellipse-like, is called the major axis. The smaller of these two axes, and the smallest distance across the ellipse or ellipse-like, is called the minor axis. The terms "semi-major axis" and "semi-minor axis" are one half of the major and minor axes, respectively.

Figure 2:
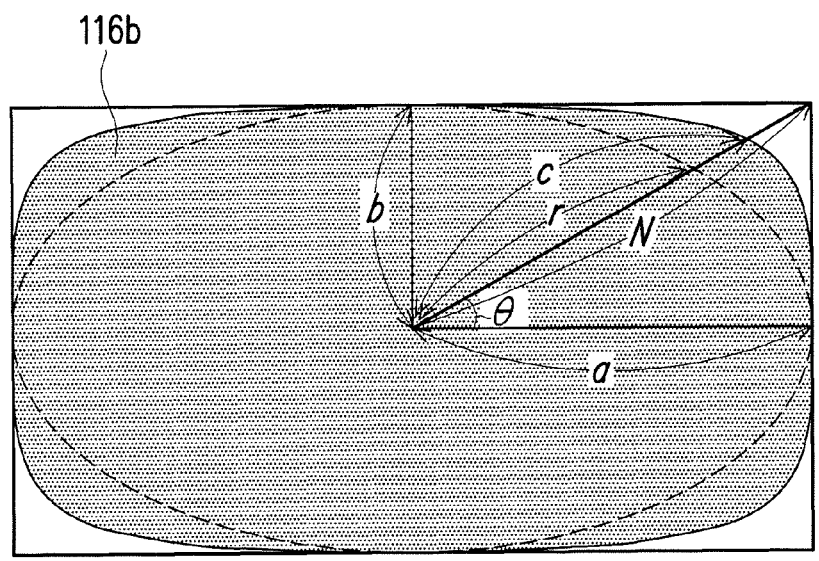
FIG. 2 is a schematic cross-sectional view of a narrow part of a bit line of the memory device in FIG. 1.

FIG. 1 is a schematic perspective view of a memory device according to an embodiment of the present invention. FIG. 2 is a schematic cross-sectional view of a narrow part of a bit line of the memory device in FIG. 1. FIG. 3A to FIG. 3H are schematic perspective views of a method of forming a memory device according to a first embodiment of the present invention.

FIG. 1 is a memory device formed through steps of FIG. 3A to FIG. 3H, in which only bit lines and supporting structures of the memory device are shown for clarity and convenience of illustration.

Figure 3A:
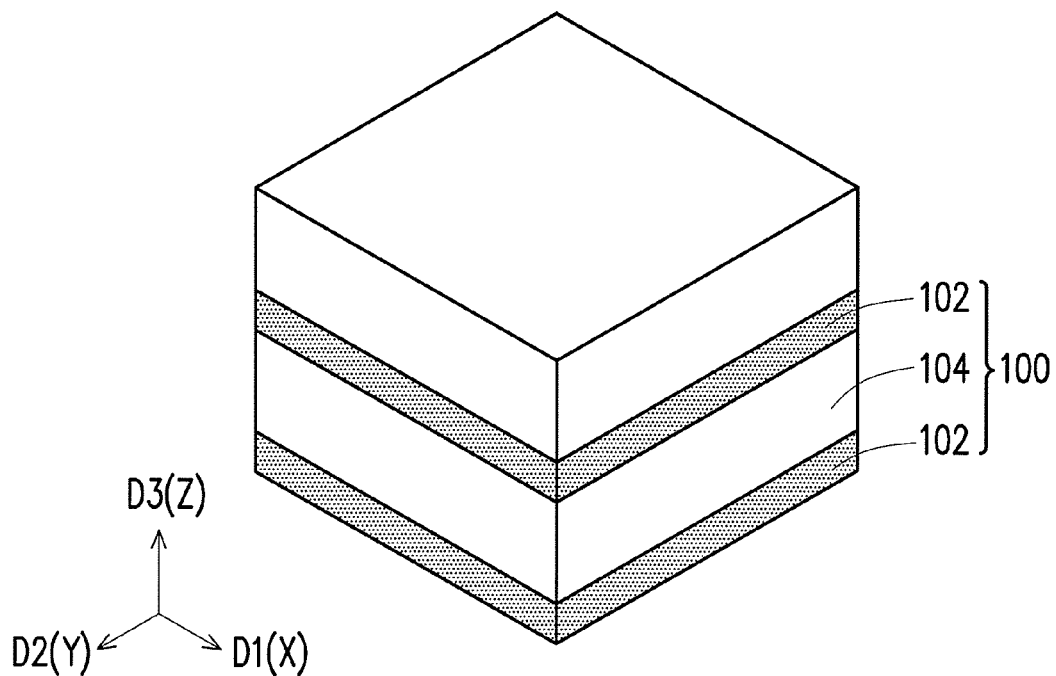
FIG. 3A to FIG. 3H are schematic perspective views of a method of forming a memory device according to a first embodiment of the present invention.
Figure 3B:
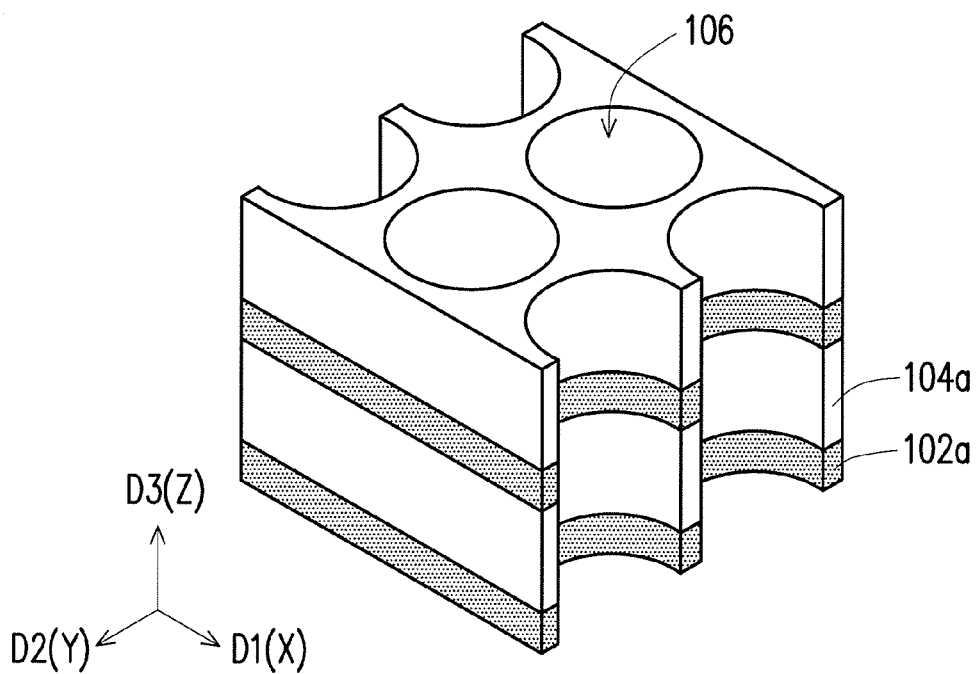
Figure 3C:
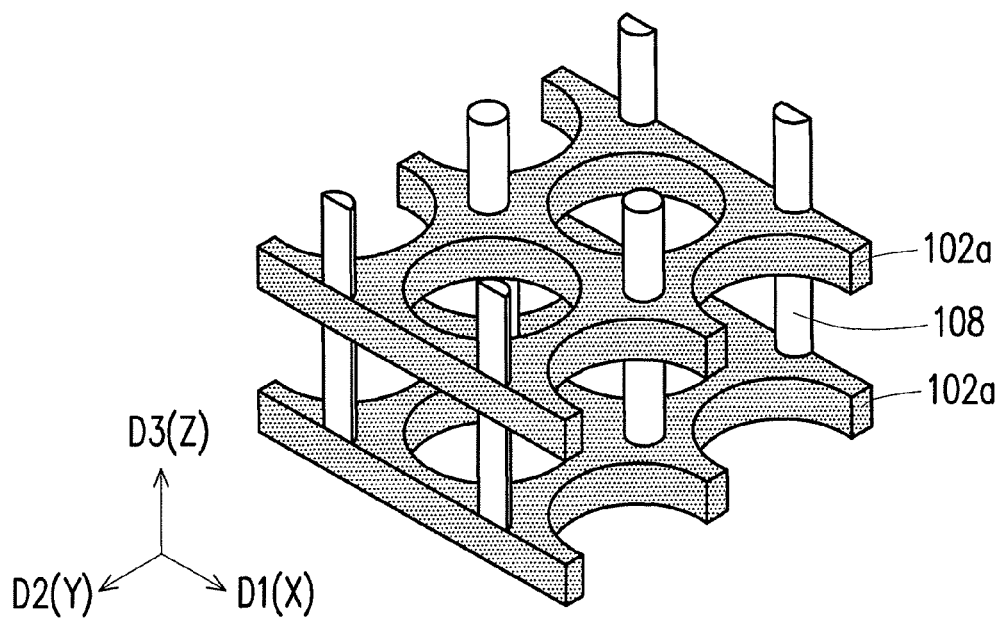
Figure 3D:
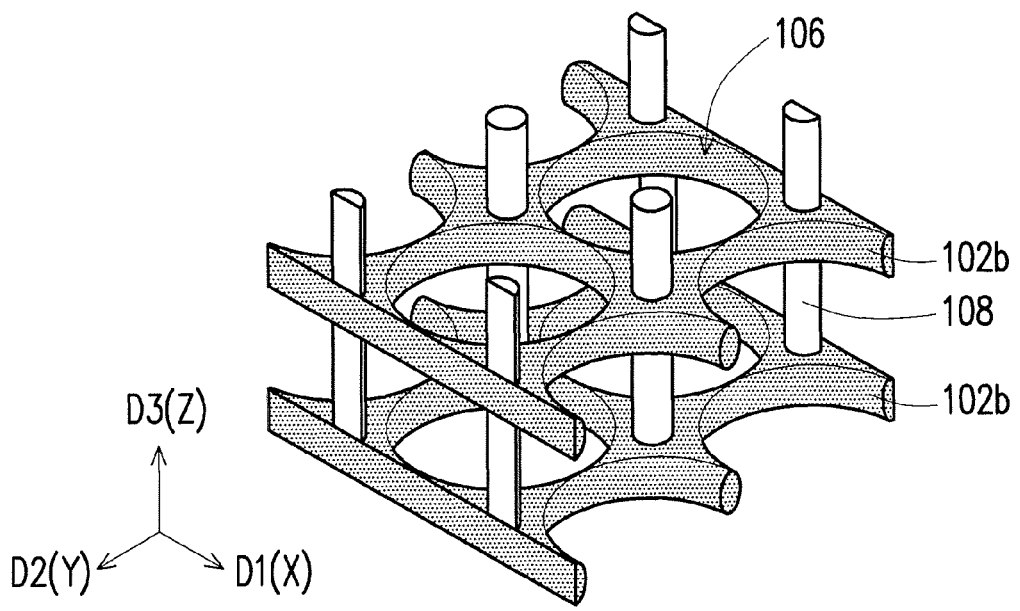
Figure 3E:
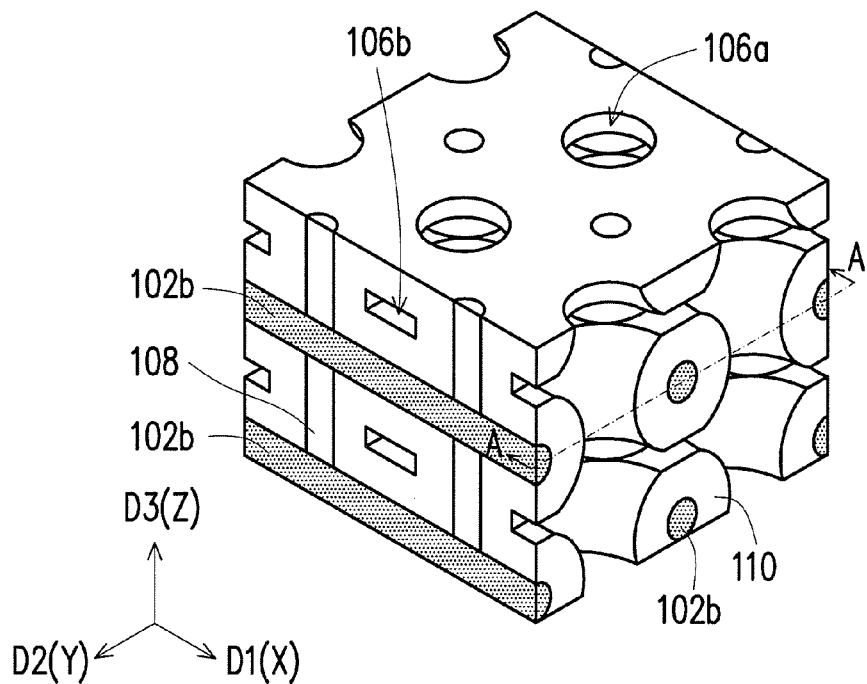
Figure 3F:
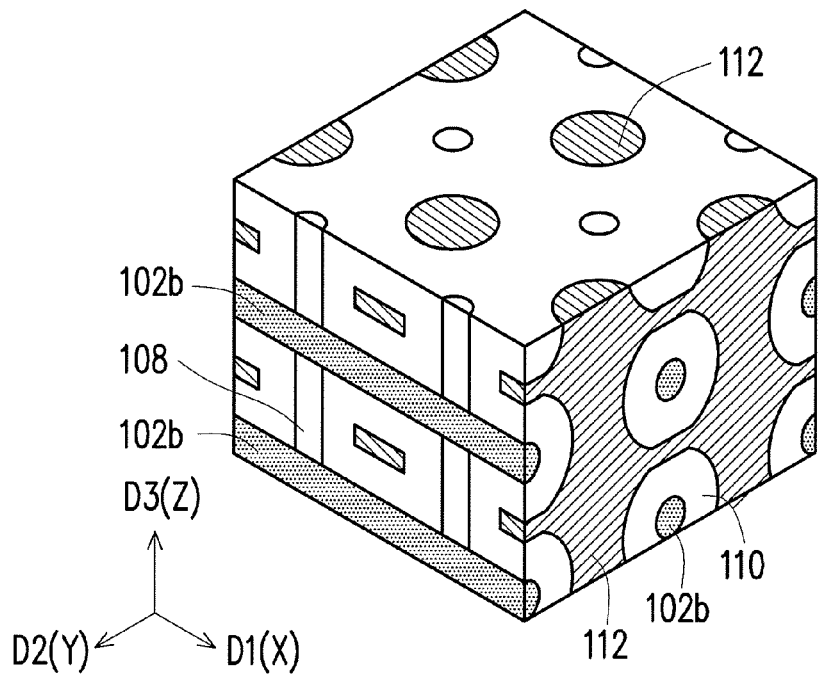
Figure 3G:
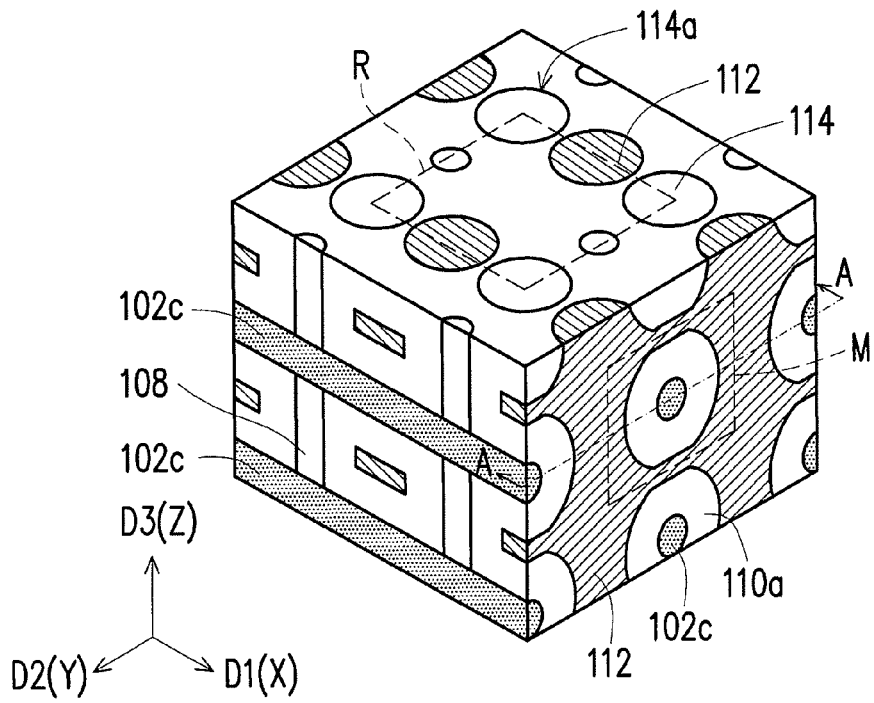

Referring to FIG. 1 and FIG. 3G, an embodiment of the invention provides a memory device 10, which includes a plurality of bit line layers BLL and a plurality of supporting structures 108. Each bit line layer BLL extends in a plane defined by a first direction D1 and a second direction D2, for example, the X-Y plane. Each bit line layer BLL has a plurality of bit lines 102c extending along the first direction D1. Each bit line 102c has a plurality of wide parts 116a and a plurality of narrow parts 116b arranged alternately, wherein the width of each wide part 116a is greater than the width of each narrow part 116b. The supporting structures 108 are disposed between the wide parts 116a of the corresponding bit lines 102c of adjacent bit line layers BLL. Specifically, the supporting structures 108 are respectively disposed between the wide parts 116a of the upper bit lines 102c and the corresponding wide parts of the lower bit lines 102c. Referring to FIG. 3G, in an embodiment of the present invention, the memory device 10 further includes a charge storage layer 110a and a plurality of conductive layers 112. The charge storage layer 110a covers top surfaces, bottom surfaces and side surfaces of the bit lines 102c and covers the surfaces of the supporting structures 108. Each conductive layer 112 extends in a plane defined by the second direction D2 and a third direction D3, for example, the Y-Z plane. Each conductive layer 112 is disposed between adjacent supporting structures 108, surrounds a portion of charge storage layer 110a on the narrow parts 116b of the corresponding bit lines 102c. In an embodiment, the first direction D1, the second direction D2 and the third direction D3 can be perpendicular to each other.

It is noted that, as shown in FIG. 1 and FIG. 2, in an embodiment of the invention, the corner of each of the wide parts 116a and the narrow parts 116b of each bit line 102c is rounded. In an embodiment, due to the process tolerance limits, each narrow part 116b of each bit line 102c substantially has a circle shape, a circle-like shape, a stretched circle shape, an ellipse shape or an ellipse-like shape in cross section.

In an embodiment, each narrow part 116b of each bit line 102c substantially has an ellipse-like shape in cross section and has a rounding ratio (RR) of greater than about 30%, and the rounding ratio is defined by formula (1):

$$RR = \frac{(N-c)}{(N-r)} \times 100\%, \quad (1)$$

$$r = \frac{ab}{\sqrt{a^2\sin^2\theta + b^2\cos^2\theta}}, \quad (2)$$

wherein r is defined by formula (2);

a is a length of a major semi-axis of the ellipse-like shape;

b is a length of a minor semi-axis of the ellipse-like shape;

N is a length of a diagonal line of a rectangular defined by the major semi-axis and the minor semi-axis of the ellipse-like shape;

θ is an included angle between the diagonal line of the rectangle and the major semi-axis of the ellipse-like shape; and c is a distance from a center of the ellipse-like shape, along the diagonal line of the rectangle, to an edge of the ellipse-like shape.

As shown in FIG. 2, when each narrow part 116b of each bit line 102c is a perfect ellipse in cross section, r is equal to c, and the rounding ratio defined by formula (1) is equal to 100%.

As the rounding ratio of each narrow part 116b of each bit line 102c is increased, the local electric field at corners of the bit lines is decreased during the device operation, and the local charge storage uniformity of the charge storage layer is accordingly improved.

The memory device 10 of the invention can be fabricated according to one of the process flows of the first, second and third embodiments of the invention, and the details are illustrated below.

Figure 7:
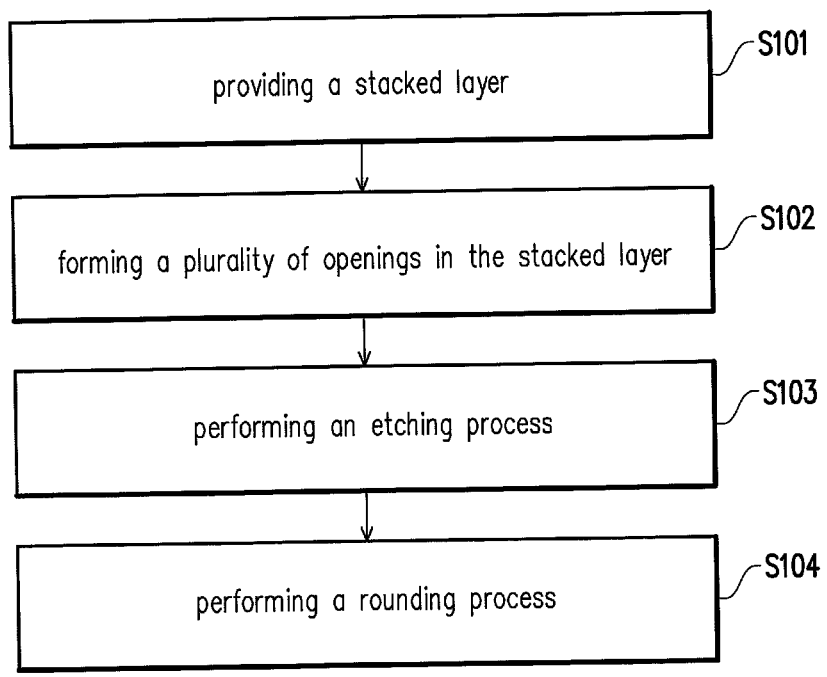
FIG. 7 is a process flow of the memory device according to the first embodiment of the present invention.

FIG. 3A to FIG. 3H are schematic perspective views of a method of forming a memory device according to a first embodiment of the present invention. FIG. 4 is a cross-sectional view taken along the line A-A of FIG. 3G. FIG. 7 is a process flow of the memory device according to the first embodiment of the present invention.

Referring to FIG. 3A and FIG. 7, in step S101, a stacked layer 100 is provided. The stacked layer 100 includes at least two first conductive layers 102 and at least one supporting material layer 104. The at least one supporting material layer 104 is disposed between the at least two first conductive layers 102. The first conductive layers 102 and the supporting material layers 104 all extend in a plane defined by the first direction D1 and the second direction D2, e.g. the X-Y plane, and are arranged alternately along the third direction D3 (e.g. Z-direction). In an embodiment, the thickness of each first conductive layer 102 is equal to about 5 nm or more. The thickness of each first conductive layer 102 can be about 20 nm, for example. The thickness of each supporting material layer 104 is equal to about 45 nm or more. The thickness of each supporting material layer 104 can be about 50 nm, for example.

The said embodiment of FIG. 3A in which the stacked layer 100 includes two first conductive layers 102 and two supporting material layers 104 arranged alternately is illustrated for illustration purposes, and is not construed as limiting the present invention. That is, the number of the first conductive layers 102 or the supporting material layers 104 is not limited by the present invention.

The method of forming the stacked layer 100 includes forming the first conductive layers 102 and the supporting material layers 104 alternately. The method of forming each of the first conductive layers 102 and the supporting material layers 104 includes performing a chemical vapour deposition (CVD) process or a physical vapour deposition (PVD) process. In this embodiment, the material of the first conductive layers 102 is different from the material of the supporting material layers 104. The first conductive layers 102 include a conductive material such as polysilicon, doped polysilicon, monocrystalline silicon, metal silicide, Ti, TiN, W, WN, Ta, TaN, Pt or a combination thereof. The supporting material layers 104 include a dielectric material, such as silicon oxide (SiO), silicon nitride (SiN), silicon oxynitride (SiON), SiOC, SiC, SiOF, SiOH, a low-k material with a dielectric constant less than 4 or a combination thereof.

Referring to FIG. 3B and FIG. 7, in step S102, the stacked layer 100 is patterned to remove a portion of the first conductive layers 102 and a portion of the supporting material layers 104, so as to form a plurality of openings 106 in the stacked layer 100. The openings 106 penetrate through the stacked layer 100 along the third direction D3 (e.g. the Z-direction). In an embodiment, the openings 106 can be arranged in an array.

Referring to FIG. 3B, FIG. 3C and FIG. 7, in step S103, an etching process is performed to remove a portion of each patterned supporting material layer 104a from the openings 106, and thus, the remaining portion of each patterned supporting material layer 104a present between the adjacent patterned first conductive layers 102a serves as a plurality of supporting structures 108. Specifically, since the etching selectivity ratio of the patterned supporting material layers 104a to the patterned first conductive layers 102a is greater than about 5, most of the patterned supporting material layers 104a are removed during the etching process. Upon adjusting the etching parameters of the said etching process, the remaining portion of each patterned supporting material layer 104a forms the supporting structures 108 between the adjacent patterned first conductive layers 102a.

In this embodiment, the said etching process includes a dry etching process, a wet etching process or a combination thereof. Besides, the step sequence of the dry etching process and the wet etching process is not limited by the present invention. In an embodiment, the dry etching process can be performed before or after the wet etching process. In another embodiment, the dry etching process and the wet etching process can be performed simultaneously.

The said dry etching process can be a chemical dry etching (CDE) or a SICONI etching. In an embodiment, when the first conductive layers 102 include polysilicon and the supporting material layers 104 include silicon oxide, the chemical dry etching uses fluorine-based chemical(s) and oxygen gas as etching gases during the said etching process. The etching selectivity ratio of silicon oxide to polysilicon can be controlled by the amounts of the fluorine-based chemical(s) and oxygen gas. In an embodiment, as the equivalent ratio of the fluorine-based chemical(s) to the oxygen gas is from about 1 to 20, the etching selectivity ratio of silicon oxide to polysilicon can be about 2 to 20. In addition, the etching parameters of the etching process can be adjusted to control the etching selectivity ratio of silicon oxide to polysilicon. The etching parameters include the amount of a non-etching gas, an etching chamber pressure, a RF power and an etching time etc. In an embodiment, in the case that the etching selectivity ratio of silicon oxide to polysilicon is about 2 to 20, helium gas can be introduced at a flow rate of about 50 to 450 sccm, the etching chamber pressure can be set at about 5 mtorr to 100 mtorr, the RF power can be set at about 200 W to 2,000 W, and the etching time can be set to about 60 seconds to 300 seconds.

In another embodiment, when the first conductive layers 102 include polysilicon and the supporting material layers 104 include silicon oxide, the SICONI etching uses $NH_3$ and $NF_3$ as etching gases. When the flow rate ratio of $NH_3$ to $NF_3$ is from about 0.5 to 3, the etching selectivity ratio of silicon oxide to polysilicon is no less than about 10. In the condition that the etching chamber pressure is set at about 1 torr to 5 torr, the RF power is set at about 10 W to 50 W and the etching time of each cycle is set to about 5 seconds to 50 seconds, the etching uniformity of the etching from the high-aspect-ratio openings 106 can be improved and the critical dimension (CD) of the supporting structures 108 between the patterned first conductive layers 102a can be easily controlled.

Besides, when the said etching process is a wet etching process, a solution including fluorine-based chemical(s) can be used. The fluorine-based chemical(s) can include diluted hydrofluoric acid (DHF). In an embodiment, the fluorine-based chemical(s) can be included in a concentration of less than about 1 wt. % for achieving an improved etching uniformity.

Referring to FIG. 3C, FIG. 3D and FIG. 7, before the step of forming the charge storage layer 110, an rounding process can be performed to the patterned first conductive layers 102a, so as to form rounded first conductive layers 102b (as shown in step S104). In an embodiment, the rounding process can be only a wet etching process. In another embodiment, the rounding process can be only an oxidation process. In yet another embodiment, the rounding process includes a wet etching process followed by an oxidation process. In still another embodiment, the rounding process includes an oxidation process followed by a wet etching process. The rounding process includes a manufacturing process consisting of a wet etching process, an oxidation process or a combination thereof.

In an embodiment, a wet etching process is implemented during the rounding process. The etchant used in the wet etching process includes an ammonium hydroxide ($NH_4OH$) solution, a hydrogen peroxide ($H_2O_2$) solution, a diluted hydrofluoric acid solution or a combination thereof. In an embodiment, a standard clean 1 (SC1) is implemented at about 30° C. to 130° C. for about 10 minutes to 60 minutes. The standard clean 1 includes about 10 to 100 parts by weight of ionized water, 1 to 3 parts by weight of an ammonium hydroxide solution and about 2 to 5 parts by weight of a hydrogen peroxide solution. In another embodiment, the wafer is dipped in a diluted hydrofluoric acid solution, and then annealed in an atmosphere of pure hydrogen at about 800° C. to 1,200° C. for about 1 minute to 20 minutes. In addition to the two etching processes described above, another solution-type method can be applied to the invention as long as the method can round out the corners of the patterned first conductive layers 102a.

Referring to FIG. 3E, a charge storage layer 110 is formed on the surfaces of the rounded first conductive layers 102b and on the surfaces of the supporting structures 108. In an embodiment, the charge storage layer 110 includes an oxide-nitride-oxide (ONO) composite layer or a high-k dielectric material with a dielectric constant greater than 4. The ONO composite layer can include three or more layers. The high-k dielectric material includes $HfO_2$, $TiO_2$, $ZrO_2$, $Ta_2O_5$ or $Al_2O_3$, and the forming method thereof includes performing a CVD process, a thermal oxidation or an atomic layer deposition (ALD) process. In an embodiment, the charge storage layer 110 has a thickness of about 10 nm to 25 nm. For example, the thickness of the charge storage layer 110 can be in a range from about 15 nm to 20 nm. Such thickness range enables the surfaces of the rounded first conductive layers 102b and the supporting structures 108 to be completely covered, leaving a space in the openings 106a and 106b.

Referring to FIG. 3F, a plurality of conductive layers 112 is formed on the charge storage layer 110. The conductive layers 112 fill in the space between the rounded first conductive layers 102b, the supporting structures 108 and the charge storage layer 110 (i.e. filling in the openings 106a and 106b), and cover the surface of the charge storage layer 110. The conductive layers 112 extend in a plane defined by the second direction D2 and the third direction D3, e.g. the Y-Z plane, and are arranged along the first direction D1 (e.g. the X-direction). The first direction D1, the second direction D2 and the third direction D3 can be perpendicular to each other. The conductive layers 112 include polysilicon, metal, metal silicide or a combination thereof, and the forming method thereof includes performing a CVD process. The metal silicide includes tungsten silicide, cobalt silicide, nickel silicide, titanium silicide, copper silicide, molybdenum silicide, tantalum silicide, erbium silicide, zirconium silicide or platinum silicide.

Referring to FIG. 3G and FIG. 4 simultaneously, a plurality of dielectric pillars 114 is formed in the stacked layer 100. Specifically, a plurality of openings 114a is formed in the stacked layer 100. Thereafter, a dielectric material is filled in the openings 114a. Afterwards, an etching back process or a chemical mechanical polishing (CMP) process can be performed to remove the dielectric material outside the openings 114a and therefore form the dielectric pillars 114. The dielectric material includes silicon oxide, silicon nitride, SiON, SiOC, SiC, SiOF, SiOH, a low-k material with a dielectric constant less than 4 or a combination thereof.

The dielectric pillars 114 extend along the third direction D3 (e.g. the Z-direction). The dielectric pillars 114 are formed in a manner such that each of the rounded first conductive layers 102b is divided into a plurality of bit lines 102c extending along the first direction D1 (e.g. the X-direction), and each bit line 102c has wide parts 116a and narrow parts 116b arranged alternately. In addition, each narrow part 116b of each bit line 102c, and a portion of the charge storage layer 110a and a portion of the conductive layer 112 which surround the narrow part 116b constitute one memory cell M.

Figure 3H:
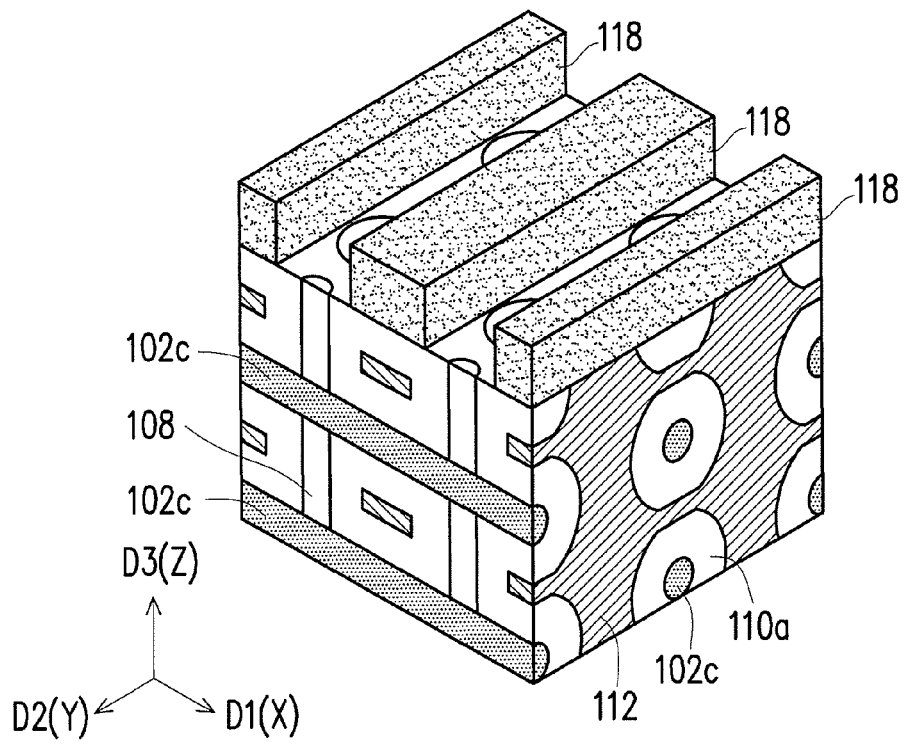
Figure 4:
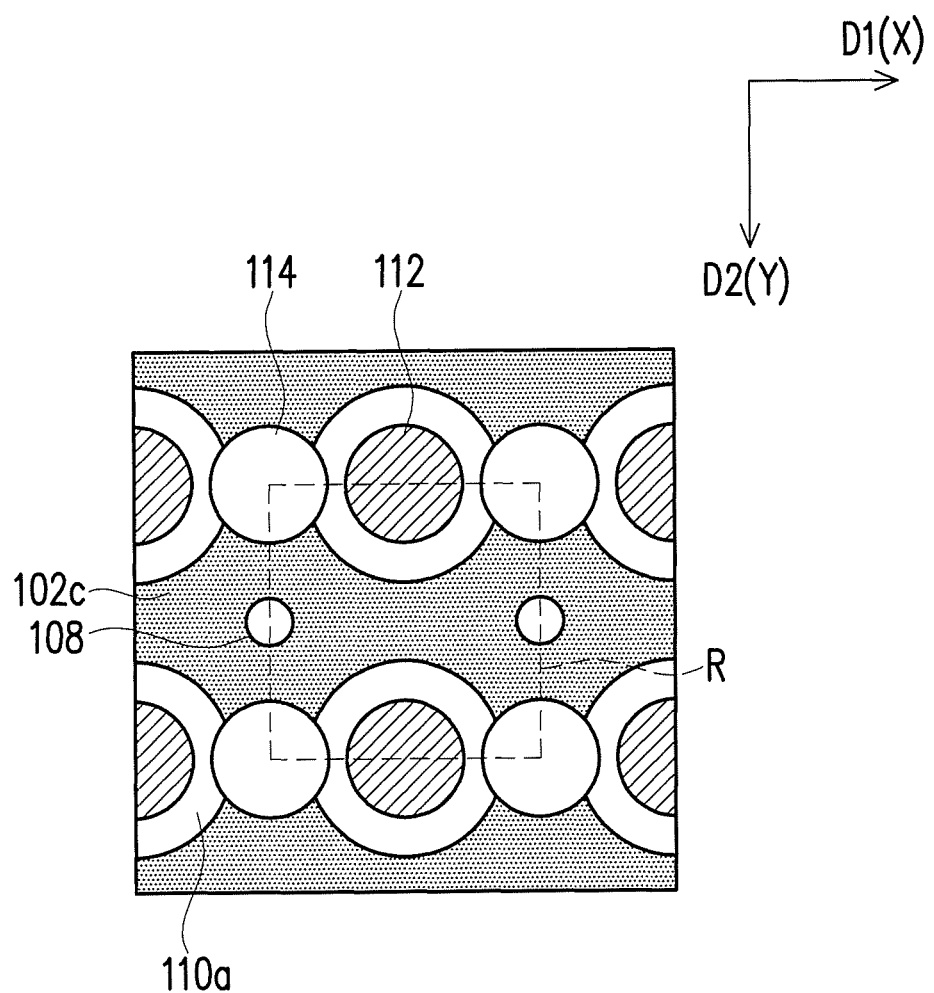
FIG. 4 is a cross-sectional view taken along the line A-A of FIG. 3G.

Referring to FIG. 3H, conductive layers 118 are respectively formed on the conductive layers 112. The conductive layers 118 extend along the second direction D2 (e.g. the Y-direction). The conductive layers 118 can serve as word line strings, each of which is electrically connected to the corresponding conductive layer 112. In addition, each conductive layer 118 can be electrically connected to the corresponding multiple memory cells M.

Referring back to FIG. 3G and FIG. 4, the memory device of this embodiment includes a plurality of memory cells M arranged in an array, and each memory cell M includes one narrow part 116b of each bit line 102c, and a portion of the charge storage layer 110a and a portion of the conductive layer 112 which cover the narrow part 116b. Since at least one supporting structure 108 is present between two adjacent memory cells M, and such supporting structures 108 can support the lower and upper bit lines 102c and prevent the three-dimensional memory device from being deformed or collapsed.

Besides, from the cross-sectional view taken along the line A-A of FIG. 3G, in the plane of FIG. 4 which is defined by the first direction D1 and the second direction D2 (e.g. the X-Y plane), the adjacent four dielectric pillars 114 can enclose a region R with one memory cell therein. When a feature size of the fabrication is F, the smallest size of a memory cell in the region R is $4F^2$. When the three-dimensional memory device has N layers of memory cells stacked together, an equivalent smallest size of the memory cell is then $4F^2/N$.

Figure 8:
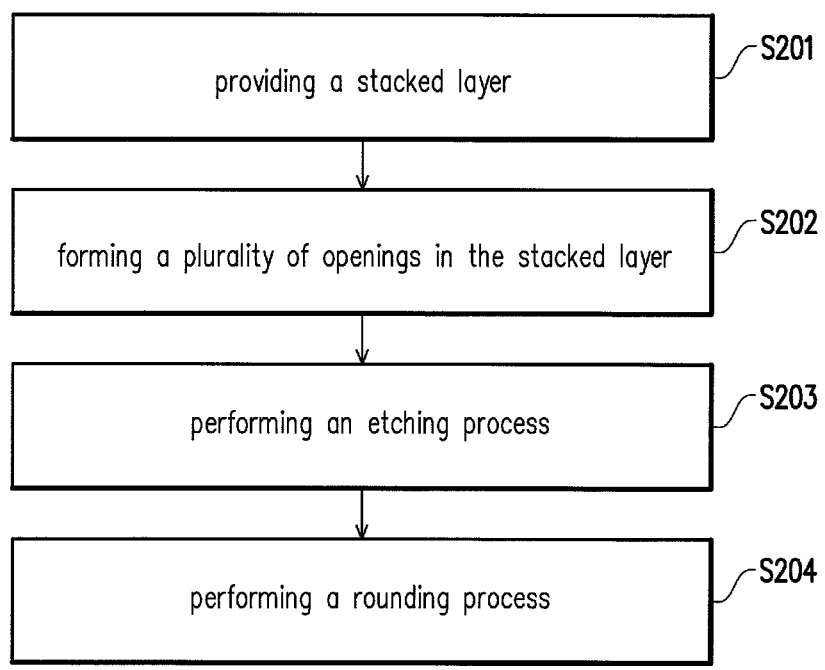
FIG. 8 is a process flow of the memory device according to the second embodiment of the present invention.

FIG. 5A to FIG. 5H are schematic perspective views of a method of forming a memory device according to a second embodiment of the present invention. FIG. 8 is a process flow of the memory device according to the second embodiment of the present invention. In the following embodiments, similar reference numerals indicate similar components. For example, the first conductive layers 102 are similar to the first conductive layers 202 and the supporting structures 108 are similar to the supporting structures 208, and thus, the materials and forming methods of these components are not iterated herein.

Figure 5A:
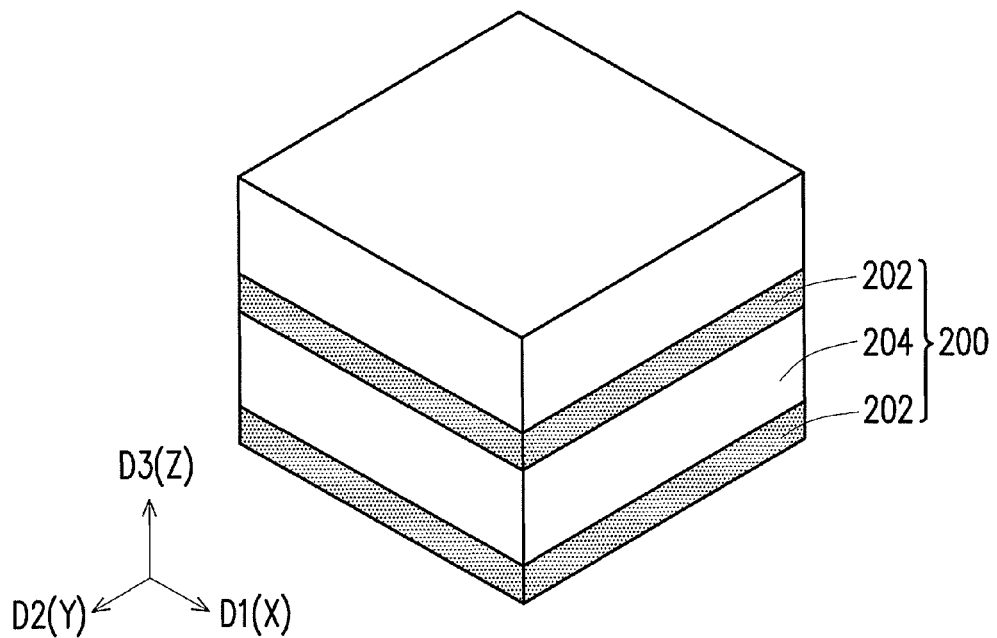
FIG. 5A to FIG. 5H are schematic perspective views of a method of forming a memory device according to a second embodiment of the present invention.
Figure 5B:
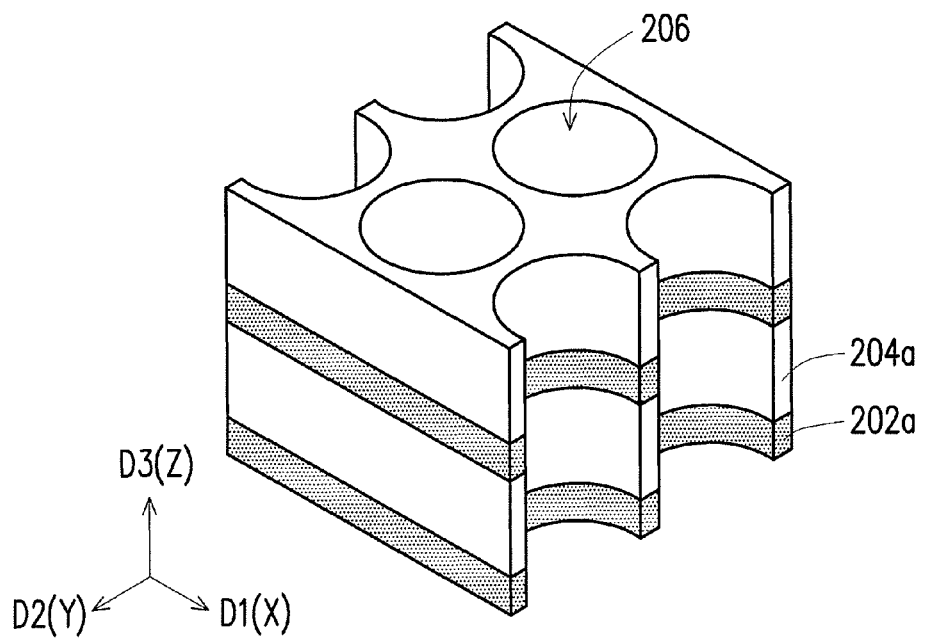
Figure 5C:
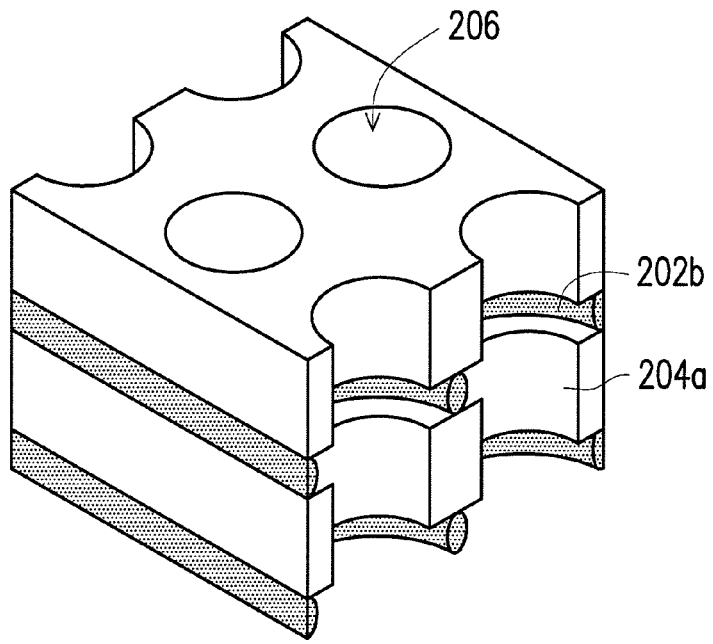
Figure 5D:
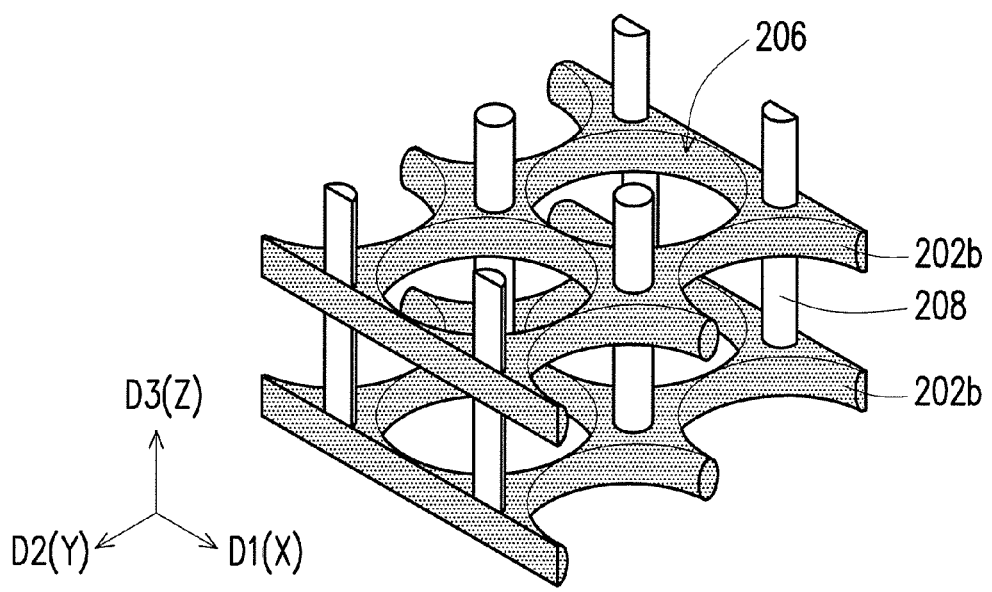
Figure 5E:
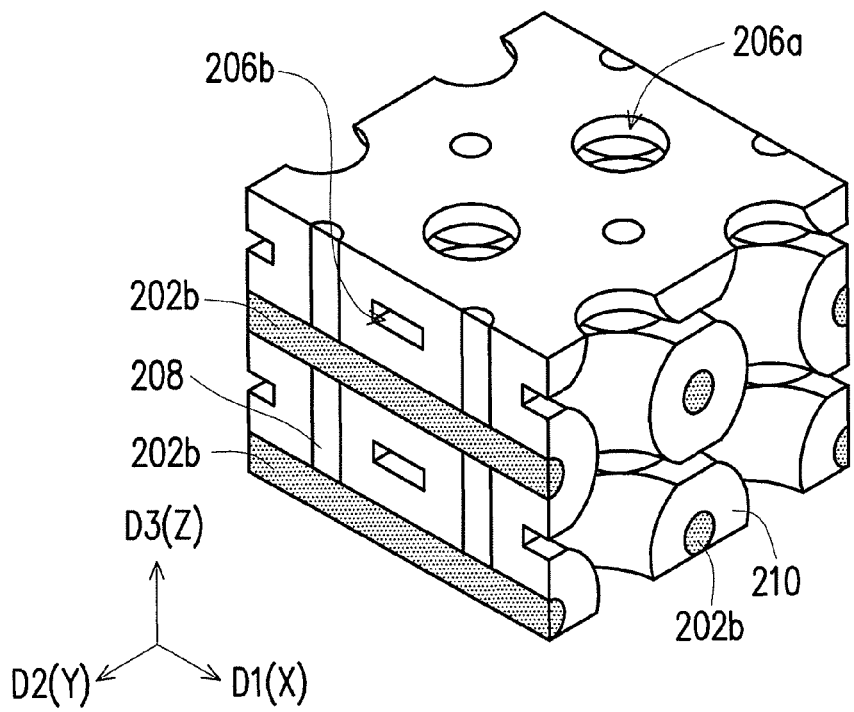
Figure 5F:
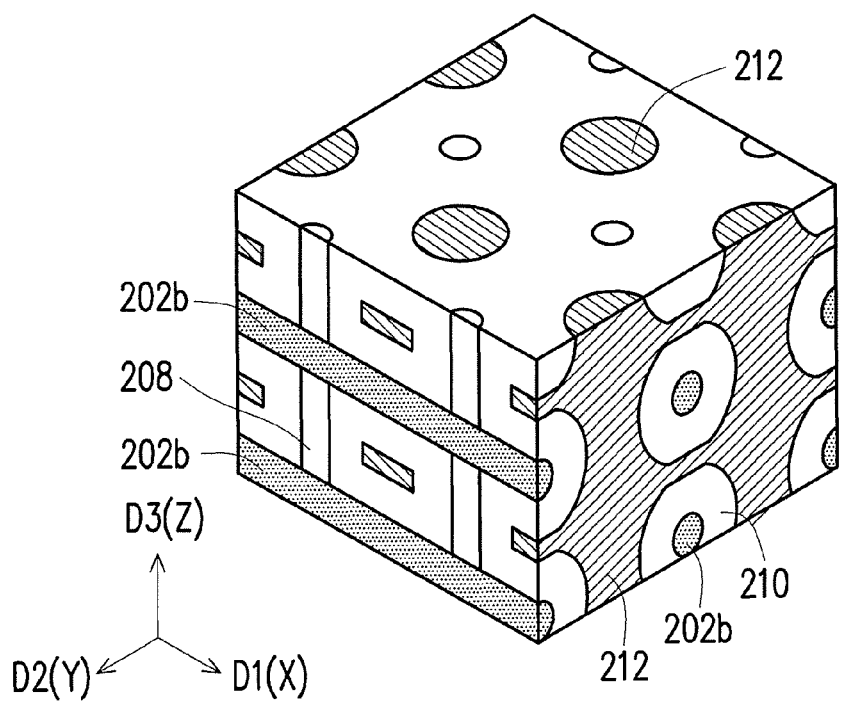
Figure 5G:
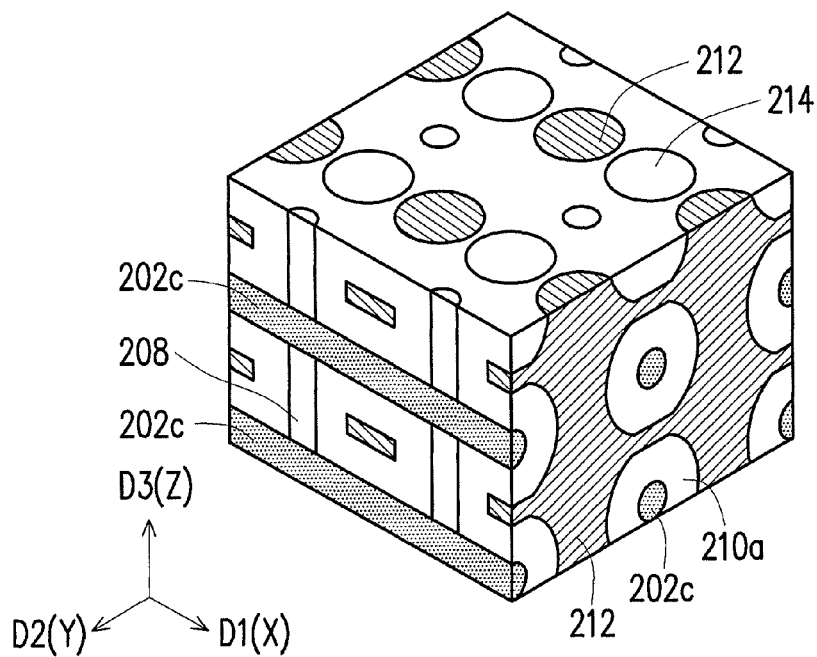
Figure 5H:
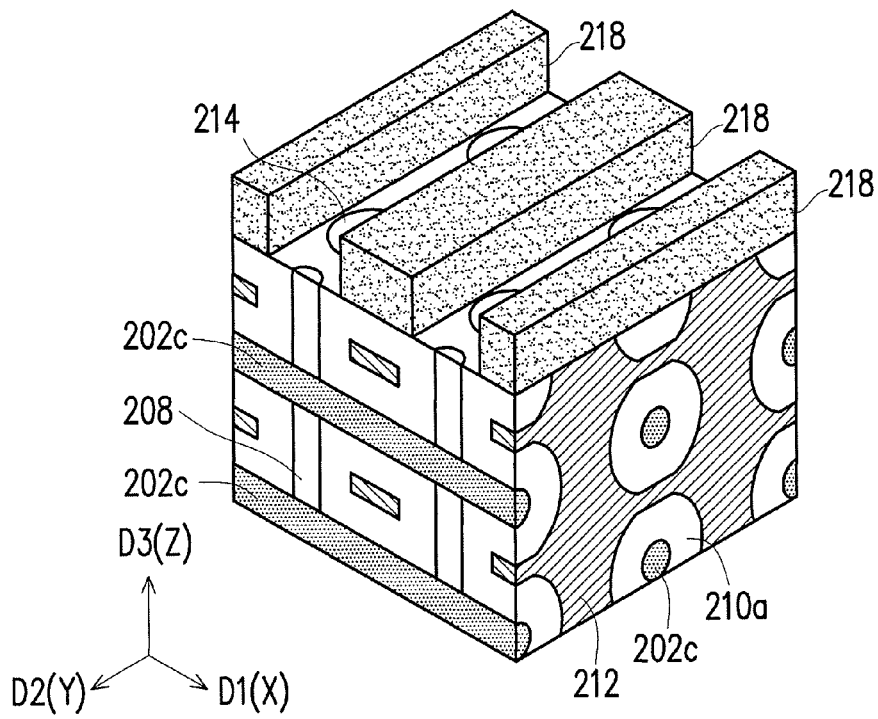

Referring to FIG. 5A and FIG. 5B simultaneously, the method of forming the memory device of the second embodiment is similar to that of the first embodiment. That is, the step S201 is similar to the step S101, and the step S202 is similar to the step S102. The difference between the two embodiments is described below. As shown in FIG. 5C and FIG. 5D, after the openings 206 are formed in the stacked layer 200, a rounding process is performed to the patterned first conductive layers 202a (as shown in step S203 and FIG. 5C), and a portion of the patterned supporting material layers 204a is then removed to form a plurality of supporting structures 208 (as shown in step S204 and FIG. 5D).

In the second embodiment, the rounding process can be an oxidation process. In an embodiment, the oxidation process includes an in-situ steam generation (ISSG), a wet oxidation, a thermal oxidation or a combination thereof. Specifically, in the second embodiment, the rounding process can be an in-situ steam generation (ISSG) by using a vapour to implement an oxidation process, wherein the reactive gas composition of the vapour includes hydrogen and oxygen, the hydrogen percentage ("% $H_2$") is about 0.5% to 33%, the oxygen percentage ("% $O_2$") is about 67% to 99.5%, and the oxidation reaction is implemented at about 600° C. to 1,200° C. for about 10 seconds to 100 seconds. The hydrogen percentage ("% $H_2$") and the oxygen percentage ("% $O_2$") are defined as follows.

$$\% \ H_2 = (R_H)/(R_H + R_O)$$

$$\% \ O_2 = (R_O)/(R_H + R_O),$$

wherein $R_H$ represents a hydrogen flow rate, and Ro represents an oxygen flow rate.

In the second embodiment, the rounding process can be a wet oxidation. Specifically, in the wet oxidation, hydrogen is set at a flow rate of about 1 slm to 10 slm, oxygen is set at a flow rate of about 5 slm to 20 slm, and the oxidation is implemented at about 500° C. to 1000° C. for about 10 minutes to 60 minutes. In addition to the ISSG and the wet oxidation described above, another suitable method such as a thermal oxidation can be applied to the invention as long as the method can round out the corners of the patterned first conductive layers 202a.

Referring to FIG. 5C, FIG. 5D and FIG. 8 simultaneously, in step S204, an etching process is performed to remove a portion of each patterned supporting material layer 204a from the openings 206, and thus, the remaining portion of each patterned supporting material layer 204a present between the adjacent rounded first conductive layers 202b serves as a plurality of supporting structures 208. In this embodiment, the said etching process includes a dry etching process, a wet etching process or a combination thereof. Besides, the step sequence of the dry etching process and the wet etching process is not limited by the present invention. In an embodiment, the dry etching process can be performed before or after the wet etching process. In another embodiment, the dry etching process and the wet etching process can be performed simultaneously. The said etching process has been described in the first embodiment, and the details are not iterated herein.

Referring to FIG. 5E to FIG. 5H, steps similar to the steps in FIG. 3E to FIG. 3H are implemented to form the memory device of the second embodiment, wherein the charge storage layer 210/210a, the conductive layers 212, the dielectric pillars 214, the bit lines 202c and the conductive layers 218 are similar to the charge storage layer 110/110a, the conductive layers 112, the dielectric pillars 114, the bit lines 102c and the conductive layers 118 of the first embodiment, and thus, the materials and forming methods of these components are not iterated herein.

Figure 9:
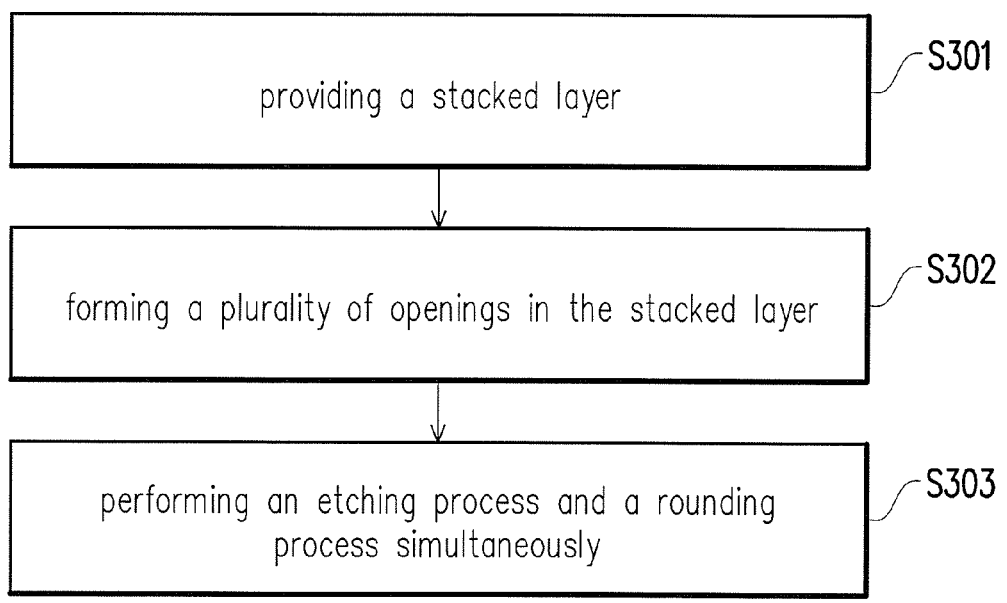
FIG. 9 is a process flow of the memory device according to the third embodiment of the present invention.

FIG. 6A to FIG. 6G are schematic perspective views of a method of forming a memory device according to a third embodiment of the present invention. FIG. 9 is a process flow of the memory device according to the third embodiment of the present invention.

Figure 6A:
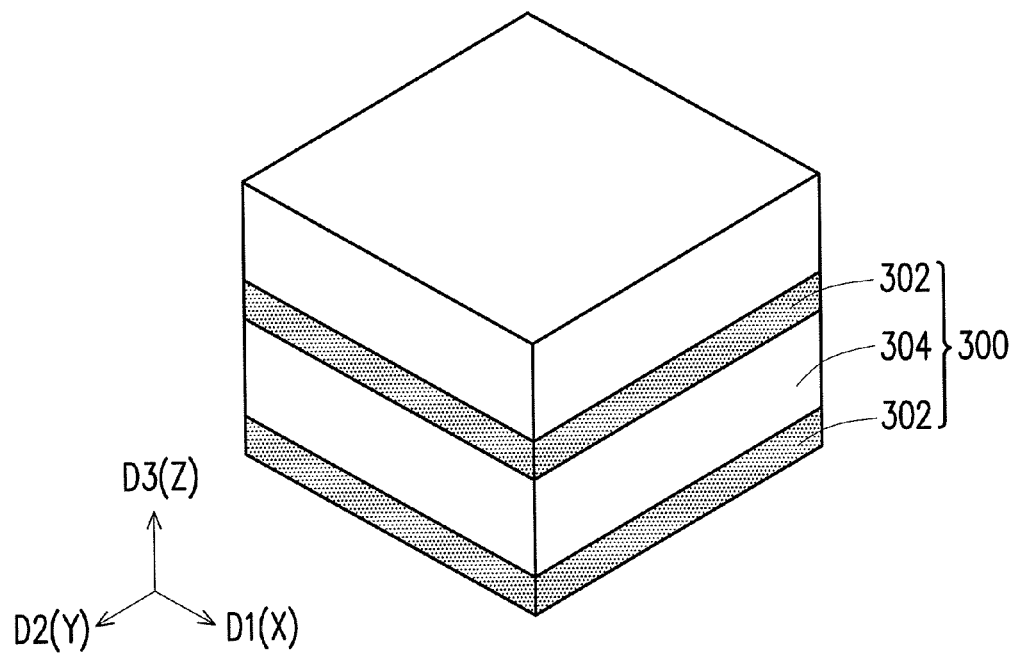
FIG. 6A to FIG. 6G are schematic perspective views of a method of forming a memory device according to a third embodiment of the present invention.
Figure 6B:
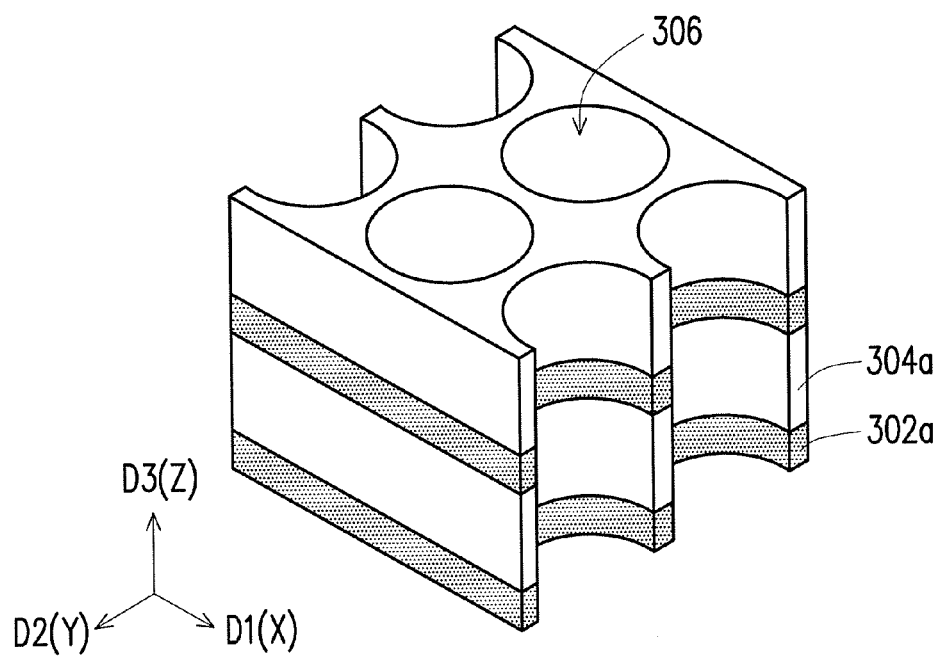
Figure 6C:
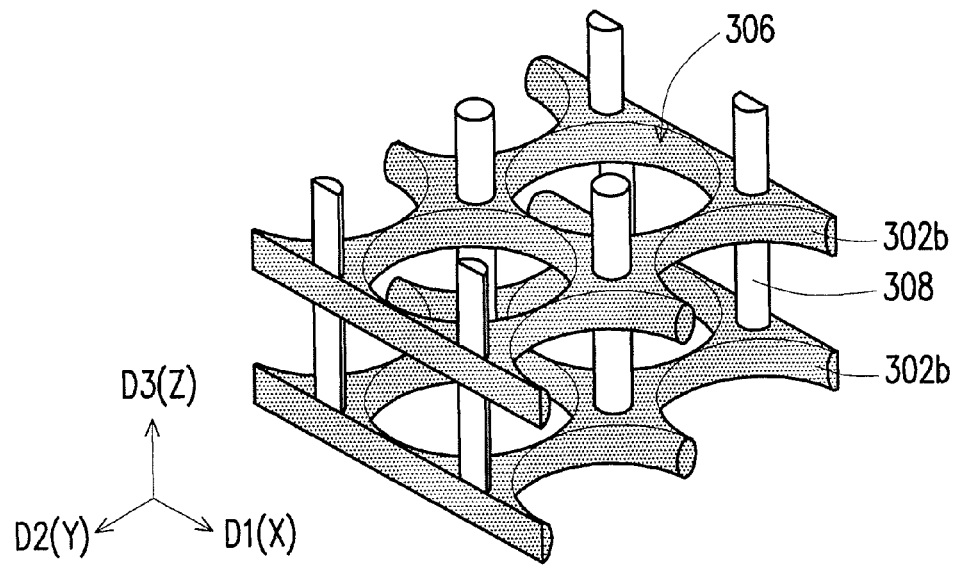
Figure 6D:
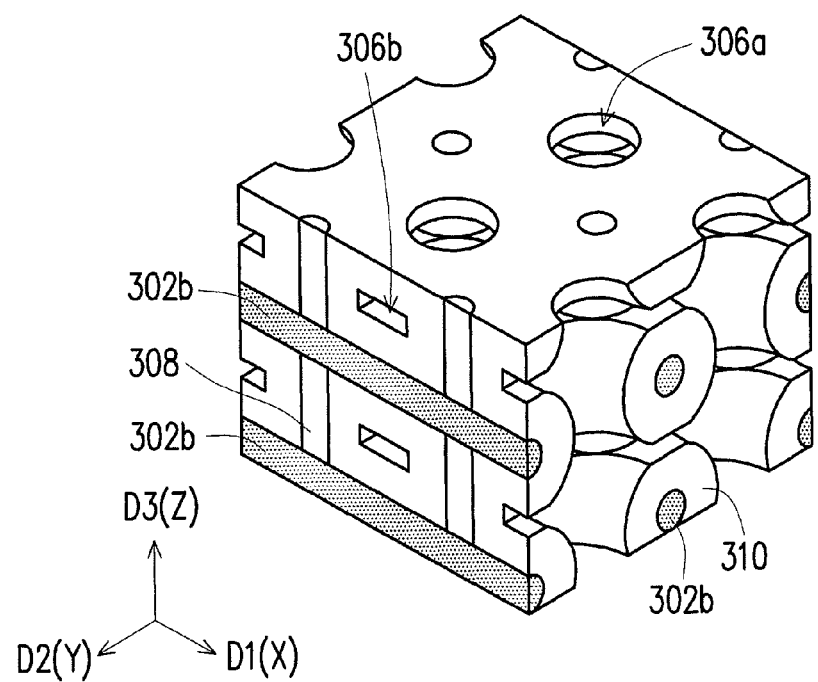
Figure 6E:
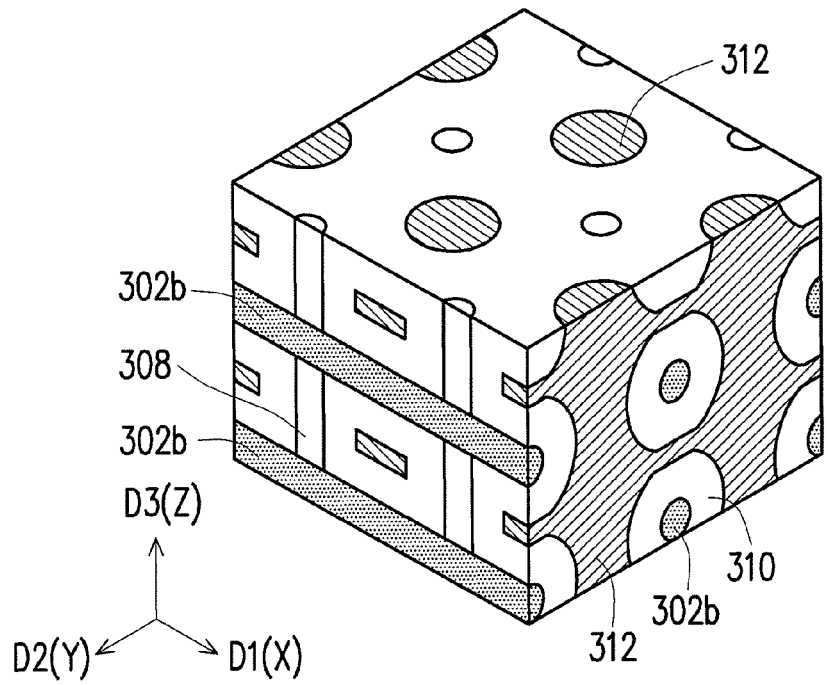
Figure 6F:
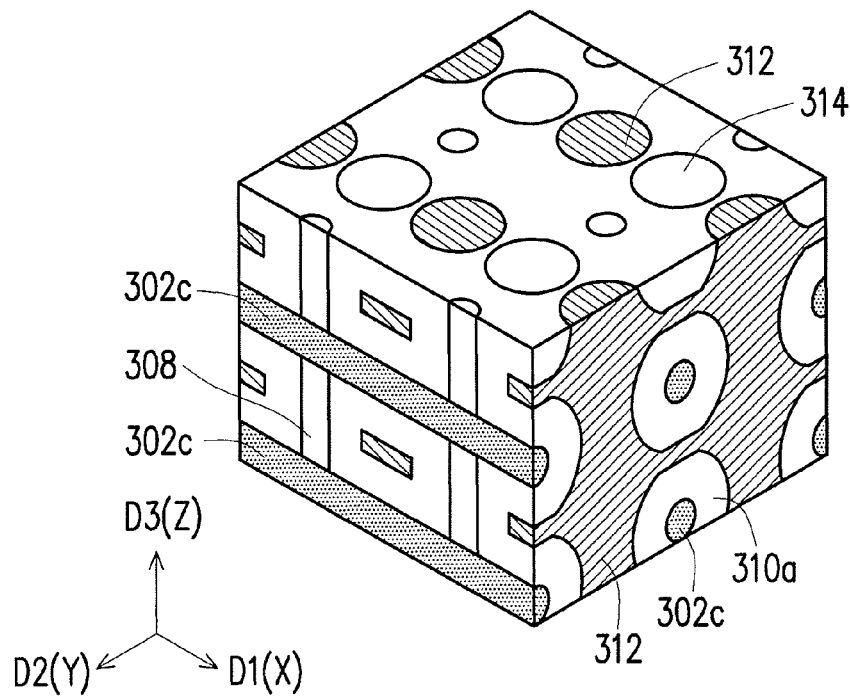
Figure 6G:
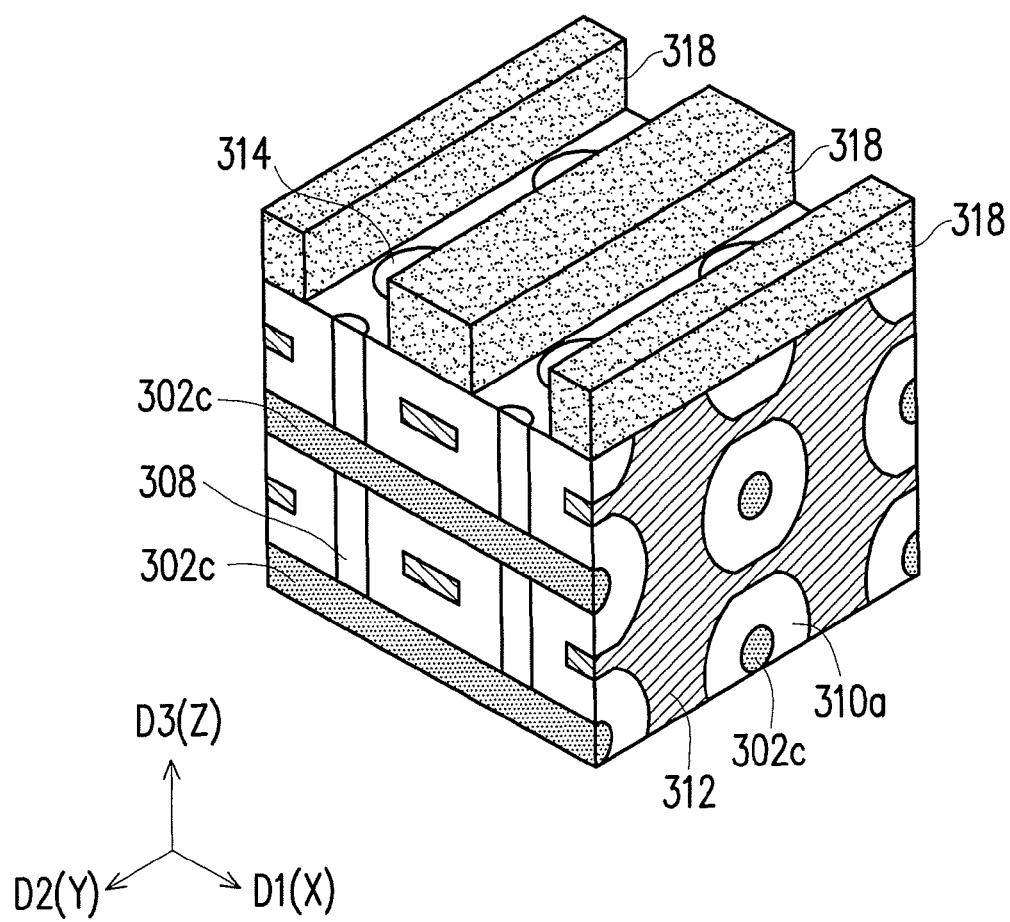

Referring to FIG. 6A to FIG. 6C and FIG. 9 simultaneously, the method of forming the memory device of the third embodiment is similar to that of the first embodiment. That is, the step S301 is similar to the step S101, and the step S302 is similar to the step S102. The difference between the two embodiments is described below. As shown in FIG. 6B to FIG. 6C and FIG. 9, after the openings 306 are formed in the stacked layer 300, in step S303 of the third embodiment, a rounding process is performed to the patterned first conductive layers 302a to form rounded first conductive layers 302b, and a portion of the patterned supporting material layers 304a is simultaneously removed to form a plurality of supporting structures 308. In this embodiment, the rounding process can be a wet etching with a diluted hydrofluoric acid solution. It is noted that, since the diluted hydrofluoric acid solution of the third embodiment is used to simultaneously perform the rounding process and the partial removal step of the patterned supporting material layers 304a, so the process time of the third embodiment is about 2 to 4 times the process time of the first embodiment in which the diluted hydrofluoric acid solution is used to perform the rounding process only.

Referring to FIG. 6D to FIG. 6G, steps similar to the steps in FIG. 3E to FIG. 3H are implemented to form the memory device of the third embodiment, wherein the charge storage layer 310/310a, the conductive layers 312, the dielectric pillars 314, the bit lines 302c and the conductive layers 318 are similar to the charge storage layer 110/110a, the conductive layers 112, the dielectric pillars 114, the bit lines 102c and the conductive layers 118 of the first embodiment, and thus, the materials and forming methods of these components are not iterated herein.

In summary, in the present invention, a rounding process is performed to improve the corner shape of each bit line, so as to reduce the local electric field at corners of the bit lines, thereby improving the local charge storage uniformity of the charge storage layer. Besides, in the present invention, since multiple supporting structures are formed between the adjacent bit line layers for supporting the adjacent lower and upper bit lines, the bit lines and therefore the three-dimensional memory device are free of the conventional deformation and collapsing issues.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method of forming a memory device, comprising:
providing a stacked layer, wherein the stacked layer comprises at least two first conductive layers and at least one supporting material layer, the supporting material layer is disposed between the first conductive layers, the first conductive layers and the supporting material layer have different materials, and each of the supporting material layer and the first conductive layers extend in a plane defined by a first direction and a second direction;
forming a plurality of openings in the stacked layer, the openings penetrating through the stacked layer;
performing an etching process to remove a portion of the supporting material layer from the openings, so that the remaining supporting material layer is served as a plurality of supporting pillars between the first conductive layers;
performing a rounding process to the first conductive layers, wherein the rounding process is performed before the etching process and the rounding process comprises an oxidation process;
forming a charge storage layer on surfaces of the first conductive layers and the supporting pillars;
forming a plurality of second conductive layers to fill in a space between the first conductive layers, the supporting pillars and the charge storage layer, wherein each of the second conductive layers extends in a plane defined by the second direction and a third direction, and the first direction, the second direction and the third direction are perpendicular to each other; and
forming a plurality of dielectric pillars extending along the third direction, wherein the dielectric pillars are formed in a manner such that each of the first conductive layers is divided into a plurality of bit lines extending along the first direction.

2. The method of claim 1, wherein the etching process comprises a dry etching process, a wet etching process or a combination thereof.

3. The method of claim 1, wherein an etching selectivity ratio of the supporting material layer to the first conductive layers is greater than about 5.

4. The method of claim 1, wherein the rounding process comprises a manufacturing process consisting of a combination of the wet etching process and the oxidation process.

5. The method of claim 1, wherein the oxidation process comprises an in-situ steam generation (ISSG), a wet oxidation, a thermal oxidation or a combination thereof.

6. The method of claim 1, wherein the first conductive layers comprise polysilicon, doped polysilicon, monocrystalline silicon or a combination thereof.

7. The method of claim 1, wherein each of the bit lines has a plurality of wide parts and a plurality of narrow parts arranged alternately along the first direction, and the supporting pillars are only disposed between the wide parts of the corresponding bit lines.

8. The method of claim 7, wherein the supporting pillars are in direct contact with the bit lines.

* * * * *